United States Patent
Takada et al.

(10) Patent No.: US 9,910,452 B2
(45) Date of Patent: Mar. 6, 2018

(54) REFERENCE-VOLTAGE CIRCUIT

(71) Applicant: Seiko Instruments Inc., Chiba-shi, Chiba (JP)

(72) Inventors: Kosuke Takada, Chiba (JP); Masakazu Sugiura, Chiba (JP)

(73) Assignee: SII SEMICONDUCTOR CORPORATION, Chiba-Shi, Chiba (JP)

( * ) Notice: Subject to any disclaimer, the term of this patent is extended or adjusted under 35 U.S.C. 154(b) by 280 days.

(21) Appl. No.: 14/490,399

(22) Filed: Sep. 18, 2014

(65) Prior Publication Data
US 2015/0002131 A1 Jan. 1, 2015

Related U.S. Application Data

(63) Continuation of application No. PCT/JP2013/051707, filed on Jan. 28, 2013.

(30) Foreign Application Priority Data

Mar. 22, 2012 (JP) ................................ 2012-065976
Sep. 26, 2012 (JP) ................................ 2012-212944

(51) Int. Cl.
G05F 3/24 (2006.01)
G05F 3/26 (2006.01)
(Continued)

(52) U.S. Cl.
CPC ................. *G05F 3/24* (2013.01); *G05F 3/30* (2013.01); *H03F 1/301* (2013.01); *H03F 3/345* (2013.01); *G05F 3/262* (2013.01)

(58) Field of Classification Search
CPC . G05F 3/30; G05F 3/262; G05F 3/242; G05F 3/245; G05F 3/247
See application file for complete search history.

(56) References Cited

U.S. PATENT DOCUMENTS 6,384,586 B1 * 5/2002 Sugawara ............... G05F 3/225
                                                                 323/313
7,068,093 B2    6/2006 Morishita et al.
(Continued)

FOREIGN PATENT DOCUMENTS

JP          6-309052 A    11/1994
JP      2003-345449 A    12/2003
(Continued)

OTHER PUBLICATIONS

International Search Report in corresponding International Application No. PCT/JP2013/051707, dated Apr. 16, 2013, 2 pages.

*Primary Examiner* — Nguyen Tran
*Assistant Examiner* — Monica Mata
(74) *Attorney, Agent, or Firm* — Brinks Gilson & Lione

(57) ABSTRACT

Provided is a reference voltage circuit capable of adjusting an arbitrary output voltage to have arbitrary temperature characteristics. The reference voltage circuit includes: a reference current generating circuit configured to convert a difference between forward voltages of a plurality of PN junction elements into current to generate a first current; a current generating circuit configured to use the first current generated by the reference current generating circuit to generate a second current; and a voltage generating circuit including a first resistive element and a second resistive element, the first resistive element being configured to generate a first voltage having positive temperature characteristics when the first current flows through the first resistive element, the second resistive element being configured to generate a second voltage having negative temperature characteristics when the first current and the second current flow through the second resistive element. The reference voltage circuit outputs a reference voltage obtained by adding the first voltage to the second voltage.

3 Claims, 8 Drawing Sheets

(51) Int. Cl.
  *H03F 3/345* (2006.01)
  *G05F 3/30* (2006.01)
  *H03F 1/30* (2006.01)

(56) References Cited

U.S. PATENT DOCUMENTS

| | | | |
|---|---|---|---|
| 7,372,316 B2* | 5/2008 | Chatterjee | ............... G05F 3/242 |
| | | | 327/513 |
| 2008/0129272 A1* | 6/2008 | Kimura | ..................... G05F 3/30 |
| | | | 323/315 |
| 2009/0201067 A1 | 8/2009 | Haneda | |

FOREIGN PATENT DOCUMENTS

| | | |
|---|---|---|
| JP | 2004-79555 A | 3/2004 |
| JP | 2005-242450 | 9/2005 |
| JP | 2005-242450 A | 9/2005 |
| JP | 2009-217809 A | 9/2009 |

* cited by examiner

REFERENCE-VOLTAGE CIRCUIT

RELATED APPLICATIONS

This application is a continuation of PCT/JP2013/051707 filed on Jan. 28, 2013, which claims priority to Japanese Application Nos. 2012-065976 filed on Mar. 22, 2012 and 2012-212944 filed on Sep. 26, 2012. The entire contents of these applications are incorporated herein by reference.

TECHNICAL FIELD

The present invention relates to a bandgap reference voltage circuit for generating a reference voltage, and more specifically, to a technology for adjusting temperature characteristics of the reference voltage.

BACKGROUND ART

FIG. 7 is a circuit diagram illustrating a related-art bandgap reference voltage circuit. The related-art bandgap reference voltage circuit includes PMOS transistors 602, 603, 605, and 606, NMOS transistors 604 and 609, bipolar transistors 611, 612, and 613, resistors 607 and 608, a start circuit 601, an output terminal 610, a power supply terminal 101, a ground terminal 100, and a substrate terminal 620.

The connections are now described. The PMOS transistor 602 has a gate connected to the start circuit 601, a drain connected to a gate and a drain of the NMOS transistor 609 and a gate of the NMOS transistor 604, and a source connected to the power supply terminal 101. The PMOS transistor 603 has a drain and a gate both connected to a drain of the NMOS transistor 604, and a source connected to the power supply terminal 101. The PMOS transistor 605 has a gate connected to the gate of the PMOS transistor 603, a drain connected to the drain and the gate of the NMOS transistor 609, and a source connected to the power supply terminal 101. The PMOS transistor 606 has a drain connected to the output terminal 610 and one terminal of the resistor 608, and a source connected to the power supply terminal 101. The bipolar transistor 613 has an emitter connected to the other terminal of the resistor 608, a base connected to the ground terminal 100, and a collector connected to the substrate terminal 620. The NMOS transistor 604 has the gate connected to the gate of the NMOS transistor 609, and a source connected to one terminal of the resistor 607. The bipolar transistor 611 has a base connected to the ground terminal 100, an emitter connected to the other terminal of the resistor 607, and a collector connected to the substrate terminal 620. The bipolar transistor 612 has a base connected to the ground terminal 100, an emitter connected to a source of the NMOS transistor 609, and a collector connected to the substrate terminal 620.

CITATION LIST

Patent Literature

[PTL 1] JP 6-309052 A

SUMMARY OF THE INVENTION

However, the related art has a problem in that, when the resistor 608 is adjusted for adjusting the value of the output voltage generated at the output terminal 610, the temperature characteristics of the output voltage may change. In addition, the related art has another problem in that it is difficult to output a voltage equal to or lower than the forward voltage of the PN junction of the bipolar transistor 613.

The present invention has been devised in order to solve the above-mentioned problems, and provides a reference voltage circuit capable of adjusting an arbitrary output voltage to have arbitrary temperature characteristics.

In order to solve the related-art problems, a reference voltage circuit according to one embodiment of the present invention is configured as follows.

The reference voltage circuit includes: a reference current generating circuit configured to convert a difference between forward voltages of a plurality of PN junction elements into current to generate a first current; a current generating circuit configured to use the first current generated by the reference current generating circuit to generate a second current; and a voltage generating circuit including a first resistive element and a second resistive element, the first resistive element being configured to generate a first voltage having positive temperature characteristics when the first current flows through the first resistive element, the second resistive element being configured to generate a second voltage having negative temperature characteristics when the first current and the second current flow through the second resistive element. The reference voltage circuit outputs a reference voltage obtained by adding the first voltage to the second voltage.

According to one embodiment of the present invention, an arbitrary output voltage can be adjusted to have arbitrary temperature characteristics.

DETAILED DESCRIPTION OF THE PREFERRED EMBODIMENTS

Figure 1:
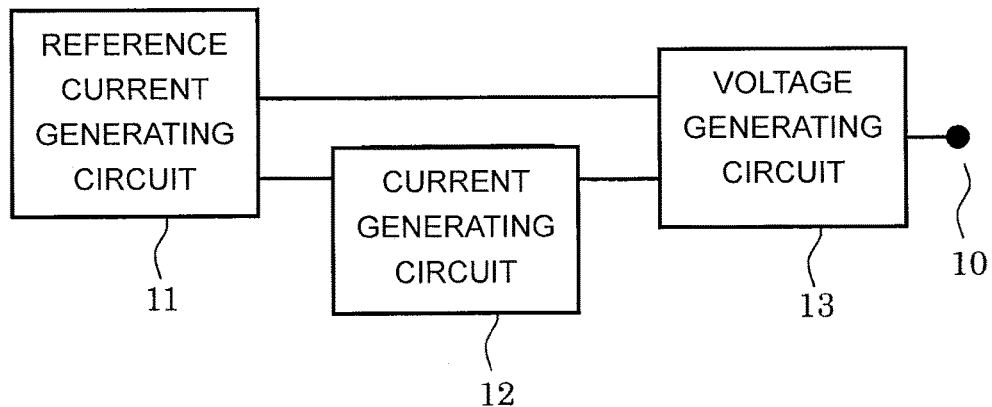
FIG. 1 is a block diagram illustrating a basic configuration of a reference voltage circuit of the present invention.

Now, embodiments of the present invention are described referring to the drawings.

FIG. 1 is a block diagram illustrating a basic configuration of a reference voltage circuit of the present invention. In FIG. 1, a reference current generating circuit 11 can convert a difference between the forward voltages of PN junction elements into current to generate a first current having an arbitrary value. A current generating circuit 12 uses the first current generated by the reference current generating circuit 11 to generate a second current. A voltage generating circuit 13 uses the first current generated by the reference current generating circuit 11 and the second current generated by the current generating circuit 12 to cause a predetermined current to flow through a resistor, to thereby generate voltage. Then, the generated voltage is output to an output terminal 10 as a reference voltage.

First Embodiment

Figure 2:
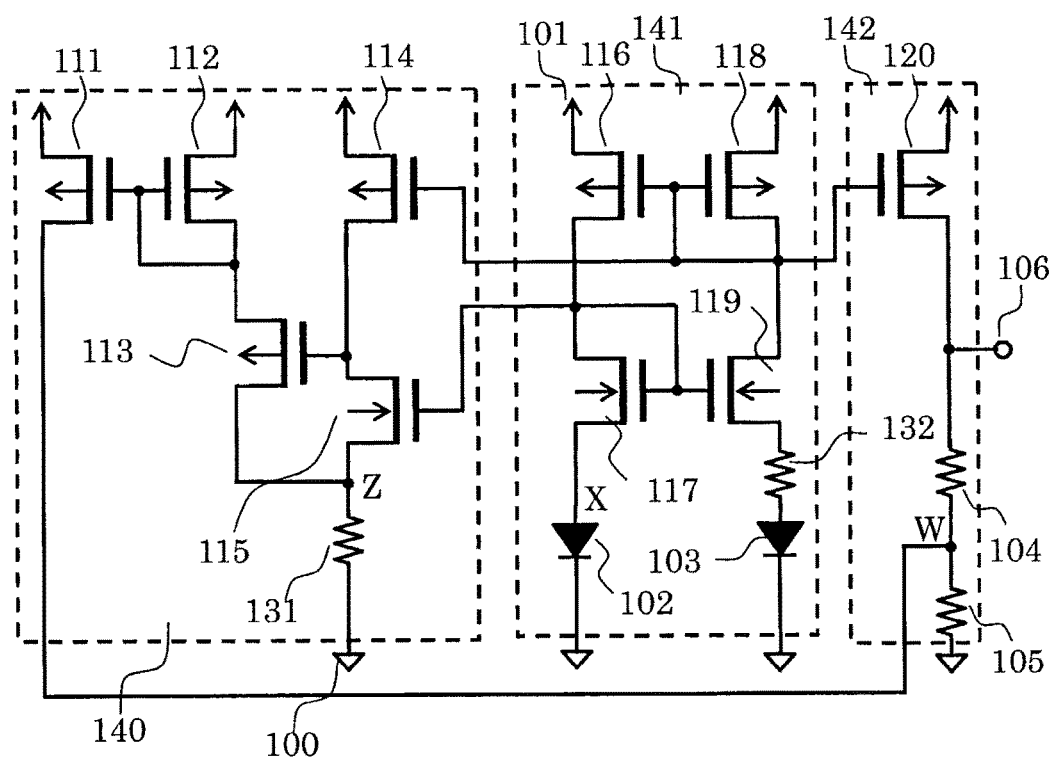
FIG. 2 is a circuit diagram illustrating a reference voltage circuit according to a first embodiment of the present invention.

FIG. 2 is a circuit diagram illustrating a reference voltage circuit according to a first embodiment of the present invention.

The reference voltage circuit according to the first embodiment includes PMOS transistors 111, 112, 113, 114, 116, 118, and 120, NMOS transistors 115, 117, and 119, resistors 131, 132, 104, and 105 PN junction elements 102 and 103, a ground terminal 100, a power supply terminal 101, and an output terminal 106. The PMOS transistors 111, 112, 113, and 114, the NMOS transistor 115, and the resistor 131 form a current generating circuit 140. The PMOS transistors 116 and 118, the NMOS transistors 117 and 119, the resistor 132, and the PN junction elements 102 and 103 form a reference current generating circuit 141. The PMOS transistor 120 and the resistors 104 and 105 form a voltage generating circuit 142.

The connections are now described. The PMOS transistor 111 has a gate connected to a gate and a drain of the PMOS transistor 112, a drain connected to a node between one terminal of the resistor 104 and one terminal of the resistor 105, and a source connected to the power supply terminal 101. The other terminal of the resistor 104 is connected to the output terminal 106, and the other terminal of the resistor 105 is connected to the ground terminal 100. The PMOS transistor 112 has the drain connected to a source of the PMOS transistor 113, and a source connected to the power supply terminal 101. The PMOS transistor 113 has a gate connected to a drain of the NMOS transistor 115, and a drain connected to a source of the NMOS transistor 115. The NMOS transistor 115 has the drain connected to a drain of the PMOS transistor 114, a gate connected to a gate of the NMOS transistor 119, and the source connected to one terminal of the resistor 131. The other terminal of the resistor 131 is connected to the ground terminal 100. The PMOS transistor 114 has a gate connected to a gate of the PMOS transistor 116, and a source connected to the power supply terminal 101. The PMOS transistor 116 has the gate connected to a gate of the PMOS transistor 118, a drain connected to a drain of the NMOS transistor 117, and a source connected to the power supply terminal 101. The PMOS transistor 118 has the gate and a drain both connected to a drain of the NMOS transistor 119, and a source connected to the power supply terminal 101. The NMOS transistor 117 has a gate and the drain both connected to the gate of the NMOS transistor 119, and a source connected to an anode of the PN junction element 102. A cathode of the PN junction element 102 is connected to the ground terminal 100. The resistor 132 has one terminal connected to a source of the NMOS transistor 119, and the other terminal connected to an anode of the PN junction element 103. A cathode of the PN junction element 103 is connected to the ground terminal 100. The PMOS transistor 120 has a gate connected to the drain of the PMOS transistor 118, a drain connected to the output terminal 106, and a source connected to the power supply terminal 101.

Next, the operation of the reference voltage circuit according to the first embodiment is described. For the sake of convenience and easy understanding, a description is given on the assumption that the resistors 131, 132, 104, and 105 have no temperature dependence. The PN junction elements 102 and 103 are formed with an appropriate area ratio (for example, 1:4), and the reference current generating circuit 141 generates a current represented by Expression 1. Because it is assumed that the resistor 132 has no temperature dependence, the current to be generated has positive temperature characteristics.

$$I = \frac{1}{R_{132}} \times \frac{k \cdot T}{q} \times \ln(m) \tag{1}$$

where m represents the area ratio of the PN junction elements 102 and 103, R132 represents a resistance value of the resistor 132, k represents the Boltzmann constant, T represents temperature, and q represents electric charges.

The PMOS transistor 114 and the PMOS transistor 118 form a current mirror, and hence a current based on the current of the PMOS transistor 118 flows through the PMOS transistor 114. For the sake of convenience and easy understanding, a description is given on the assumption that the same amount of a current I flows. The NMOS transistor 115 and the NMOS transistor 117 are the same in size, and have the gates connected to the gate of the NMOS transistor 119. The source of the NMOS transistor 117 is referred to as a node X, the source of the NMOS transistor 115 is referred to as a node Z, and the node between one terminal of the resistor 104 and one terminal of the resistor 105 is referred to as a node W.

The NMOS transistor 115 and the PMOS transistor 113 form a negative feedback loop. Because of this, the current I stably flows through the NMOS transistor 115 from the PMOS transistor 114, and the operating point of the NMOS transistor 115 is thus appropriately determined. The NMOS transistor 115 and the NMOS transistor 117 are applied with the same gate voltage and the same drain current, and hence the voltages of the node X and the node Z are the same. The resistance value of the resistor 131 is represented by R131, and a voltage generated at the PN junction element 102 is represented by V102. A current that flows through the PMOS transistor 113 is represented by Iz. The currents I and Iz flow through the resistor 131, and hence a voltage of R131×(I+Iz) is generated at the resistor 131. In addition, the voltages of the node X and the node Z are the same, and hence the voltage R131×(I+Iz) is equal to the voltage V102 of the node X.

The PMOS transistor 111 and the PMOS transistor 112 form a current mirror, and hence a current based on the current of the PMOS transistor 112 flows through the PMOS transistor 111. For the sake of convenience and easy understanding, a description is given on the assumption that the same amount of the current Iz flows. The PMOS transistor 120 and the PMOS transistor 118 form a current mirror, and hence a current based on the current of the PMOS transistor 118 flows through the PMOS transistor 120. For the sake of convenience and easy understanding, a description is given on the assumption that the same amount of the current I flows. When the resistance value of the resistor 105 is represented by R105 and the above-mentioned structure is employed, a predetermined current I+Iz flows through the resistor 105, and hence a voltage of R105×(I+Iz) is generated at the resistor 105. For the sake of convenience and easy understanding, the resistance values R105 and R131 are equal to each other, in other words, the voltage R131×(I+Iz) of the node Z and the voltage R105×(I+Iz) of the node W are equal to each other.

The voltage of the node X generated at the PN junction element 102 has negative temperature characteristics. Therefore, the voltage of the node Z and the voltage of the node W also have the negative temperature characteristics.

The current generated by the reference current generating circuit 141 has the positive temperature characteristics, and hence the current I flowing through the PMOS transistor 120 also has the positive temperature characteristics. When the resistance value of the resistor 104 is represented by R104, a voltage of I×R104 is generated across both ends of the resistor 104, which has the positive temperature characteristics.

By appropriately setting the sum of the voltage R105× (I+Iz) of the node W having the negative temperature characteristics and the voltage I×R104 that has the positive temperature characteristics and is generated across both ends of the resistor 104, an arbitrary output voltage having arbitrary temperature characteristics can be output to the output terminal 106. This operation can be achieved by, for example, adjusting the current mirror ratio of the PMOS transistor 118 and the PMOS transistor 120, the current mirror ratio of the PMOS transistor 118 and the PMOS transistor 114, the current mirror ratio of the PMOS transistor 112 and the PMOS transistor 111, and the resistance values of the resistor 104 and the resistor 105.

Figure 8:
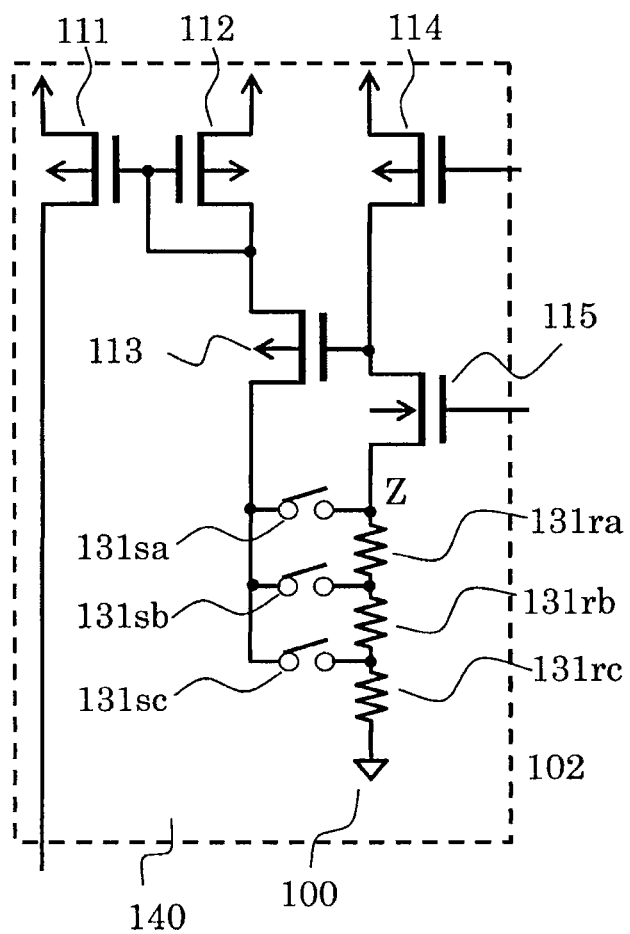
FIG. 8 is a circuit diagram illustrating means for adjusting a reference voltage in the first, second, and fifth embodiments.

In addition, as in the current generating circuit 140 illustrated in FIG. 8, the resistor 131 may be divided into resistors 131ra, 131rb, and 131rc, and switch elements 131sa, 131sb, and 131sc may be connected between the nodes of the respective resistors and the drain of the PMOS transistor 113. By arbitrarily switching those switch elements to adjust the current Iz, it is possible to adjust the voltage of the output terminal 106. Whether the resistor 131 is connected in series or in parallel, and the number of the resistors 131 are not limited to the configuration of the embodiment. Further, the material of the switch and the number of the switches are not limited to the configuration of the embodiment, and the switch may be a transistor or a fuse.

Note that, the PN junction element can be a saturated connected diode or bipolar transistor, or a MOS transistor operating in weak inversion, and is not limited to any specific form.

Note that, the above description is given on the assumption that the various current mirror ratios are equal to each other. However, as long as an arbitrary output voltage having arbitrary temperature characteristics can be output, the current mirror ratios are not specifically limited.

Note that, the NMOS transistor 115 and the NMOS transistor 117 are the same in size in the above description. However, the NMOS transistor 115 and the NMOS transistor 117 are not limited to be the same in size as long as the voltage values of the node X and the node Z can be adjusted by adjusting the resistor 131 and the current value of the current flowing through the PMOS transistor 114.

Note that, the above description is given on the assumption that the various resistors have no temperature dependence, but the resistors may have temperature dependences. When such a relationship is established that the current I and the current Iz are obviously inversely proportional to the resistance values, an output voltage, which is to be generated when a current generated based on the relationship flows through the resistors, does not directly depend on the resistance values. It is therefore apparent that, as long as the condition is satisfied that the resistors have the same kind of temperature dependence, the same effect as described above can be expected even when the resistors have the temperature dependences.

Note that, as long as the current I can be generated, the configuration of the reference current generating circuit 141 is not limited to the configuration of the first embodiment.

Note that, as long as the current Iz can be generated, the configuration of the current generating circuit 140 is not limited to the configuration of the first embodiment.

Note that, as long as the output voltage can be generated, the configuration of the voltage generating circuit 142 is not limited to the configuration of the first embodiment.

As described above, according to the reference voltage circuit of the first embodiment, by appropriately setting the sum of the voltage having the negative temperature characteristics and the voltage having the positive temperature characteristics, an arbitrary output voltage having arbitrary temperature characteristics can be obtained.

Second Embodiment

Figure 3:
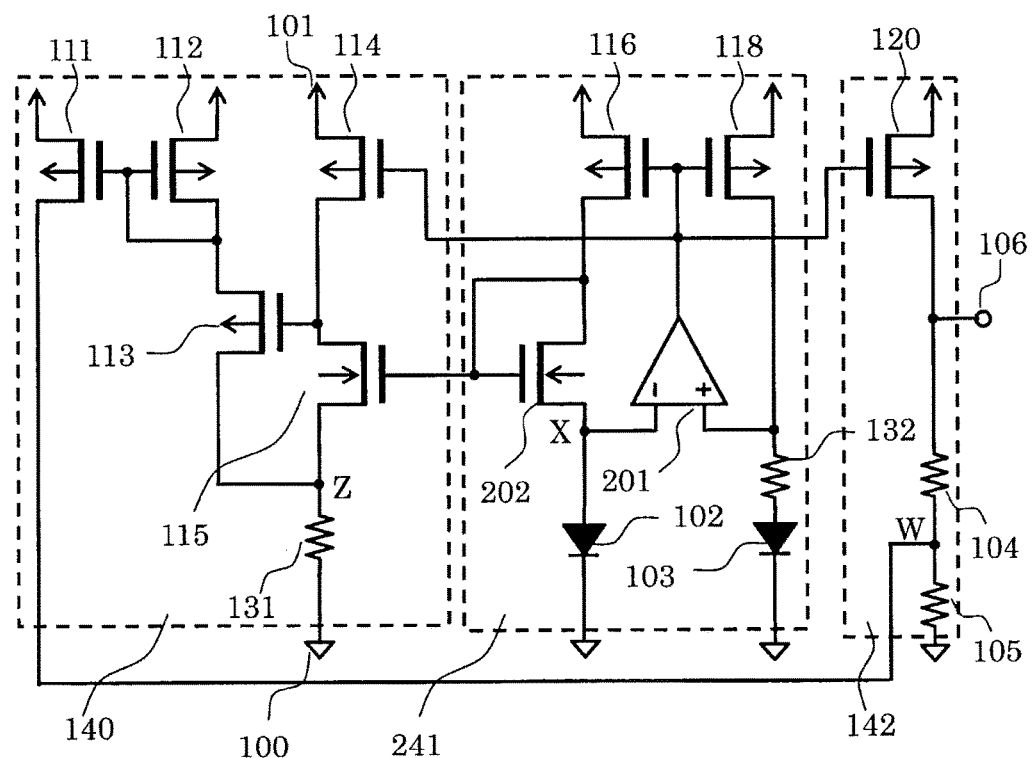
FIG. 3 is a circuit diagram illustrating a reference voltage circuit according to a second embodiment of the present invention.

FIG. 3 is a circuit diagram illustrating a reference voltage circuit according to a second embodiment of the present invention. FIG. 3 differs from FIG. 2 in that the configuration of the reference current generating circuit 141 is changed.

In the reference voltage circuit according to the second embodiment, the PMOS transistors 116 and 118, an NMOS transistor 202, the resistor 132, the PN junction elements 102 and 103, and an amplifier 201 form a reference current generating circuit 241. Other configurations are the same as those of the reference voltage circuit according to the first embodiment illustrated in FIG. 2.

The connections are now described. The amplifier 201 has an inverting input terminal connected to a source of the NMOS transistor 202 and the anode of the PN junction element 102, a non-inverting input terminal connected to one terminal of the resistor 132 and the drain of the PMOS transistor 118, and an output terminal connected to the gate of the PMOS transistor 114, the gate of the PMOS transistor 116, the gate of the PMOS transistor 118, and the gate of the PMOS transistor 120. A gate and a drain of the NMOS transistor 202 are connected to the gate of the NMOS transistor 115 and the drain of the PMOS transistor 116. Other connections are the same as those in the reference voltage circuit according to the first embodiment illustrated in FIG. 2.

Next, the operation of the reference voltage circuit according to the second embodiment is described. For the sake of convenience and easy understanding, a description is given on the assumption that the resistors 131, 132, 104, and 105 have no temperature dependence. The PN junction elements 102 and 103 are formed with an appropriate area ratio (for example, 1:4), and the reference current generating circuit 241 generates a current represented by Expression 2. Because it is assumed that the resistor 132 has no temperature dependence, the current to be generated has positive temperature characteristics.

$$I = \frac{1}{R_{132}} \times \frac{k \cdot T}{q} \times \ln(m) \qquad (2)$$

where m represents the area ratio of the PN junction elements 102 and 103, R132 represents a resistance value of the resistor 132, k represents the Boltzmann constant, T represents temperature, and q represents electric charges.

The PMOS transistors 114, 116, 118, and 120 form a current mirror, and hence a current based on the size of each PMOS transistor flows through each PMOS transistor. For the sake of convenience and easy understanding, a description is given on the assumption that the same amount of a current I flows. The NMOS transistor 115 and the NMOS transistor 202 are the same in size, and have the gates connected in common to each other. The source of the NMOS transistor 202 is referred to as a node X, the source of the NMOS transistor 115 is referred to as a node Z, and the node between one terminal of the resistor 104 and one terminal of the resistor 105 is referred to as a node W.

The NMOS transistor 115 and the PMOS transistor 113 form a negative feedback loop. Because of this, the current I stably flows through the NMOS transistor 115 from the PMOS transistor 114, and the operating point of the NMOS transistor 115 is thus appropriately determined. The NMOS transistor 115 and the NMOS transistor 202 are applied with the same gate voltage and the same drain current, and hence the voltages of the node X and the node Z are the same. The resistance value of the resistor 131 is represented by R131, and a voltage generated at the PN junction element 102 is represented by V102. A current that flows through the PMOS transistor 113 is represented by Iz. The currents I and Iz flow through the resistor 131, and hence a voltage of R131×(I+Iz) is generated at the resistor 131. In addition, the voltages of the node X and the node Z are the same, and hence the voltage R131×(I+Iz) is equal to the voltage V102.

The PMOS transistor 111 and the PMOS transistor 112 form a current mirror, and hence a current based on the current of the PMOS transistor 112 flows through the PMOS transistor 111. For the sake of convenience and easy understanding, a description is given on the assumption that the same amount of the current Iz flows. The PMOS transistor 120 and the PMOS transistor 116 form a current mirror, and hence a current based on the current of the PMOS transistor 116 flows through the PMOS transistor 120. For the sake of convenience and easy understanding, a description is given on the assumption that the same amount of the current I flows. When the resistance value of the resistor 105 is represented by R105 and the above-mentioned structure is employed, a predetermined current I+Iz flows through the resistor 105, and hence a voltage of R105×(I+Iz) is generated at the resistor 105. For the sake of convenience and easy understanding, the resistance values R105 and R131 are equal to each other, in other words, the voltage R131×(I+Iz) of the node Z and the voltage R105×(I+Iz) of the node W are equal to each other.

The voltage of the node X generated at the PN junction element 102 has negative temperature characteristics. Therefore, the voltage of the node Z and the voltage of the node W also have the negative temperature characteristics.

The current generated by the reference current generating circuit 241 has the positive temperature characteristics, and hence the current I flowing through the PMOS transistor 120 also has the positive temperature characteristics. When the resistance value of the resistor 104 is represented by R104, a voltage of I×R104 is generated across both ends of the resistor 104, which has the positive temperature characteristics.

By appropriately setting the sum of the voltage R105×(I+Iz) of the node W having the negative temperature characteristics and the voltage I×R104 that has the positive temperature characteristics and is generated across both ends of the resistor 104, an arbitrary output voltage having arbitrary temperature characteristics can be output to the output terminal 106. This operation can be achieved by, for example, adjusting the current mirror ratio of the PMOS transistor 116 and the PMOS transistor 120, the current mirror ratio of the PMOS transistor 116 and the PMOS transistor 114, the current mirror ratio of the PMOS transistor 112 and the PMOS transistor 111, and the resistance values of the resistor 104 and the resistor 105.

In addition, as in the current generating circuit 140 illustrated in FIG. 8, the resistor 131 may be divided into the resistors 131ra, 131rb, and 131rc, and the switch elements 131sa, 131sb, and 131sc may be connected between the nodes of the respective resistors and the drain of the PMOS transistor 113. By arbitrarily switching those switch elements to adjust the current Iz, it is possible to adjust the voltage of the output terminal 106. Whether the resistor 131 is connected in series or in parallel, and the number of the resistors 131 are not limited to the configuration of the embodiment. Further, the material of the switch and the number of the switches are not limited to the configuration of the embodiment, and the switch may be a transistor or a fuse.

Note that, the PN junction element can be a saturated connected diode or bipolar transistor, or a MOS transistor operating in weak inversion, and is not limited to any specific form.

Note that, the above description is given on the assumption that the various current mirror ratios are equal to each other. However, as long as an arbitrary output voltage having arbitrary temperature characteristics can be output, the current mirror ratios are not specifically limited.

Note that, the NMOS transistor 115 and the NMOS transistor 117 are the same in size in the above description. However, the NMOS transistor 115 and the NMOS transistor 117 are not limited to be the same in size as long as the voltage values of the node X and the node Z can be adjusted by adjusting the resistor 131 and the current value of the current flowing through the PMOS transistor 114.

Note that, the above description is given on the assumption that the various resistors have no temperature dependence, but the resistors may have temperature dependences. When such a relationship is established that the current I and the current Iz are obviously inversely proportional to the resistance values, an output voltage, which is to be generated when a current generated based on the relationship flows through the resistors, does not directly depend on the resistance values. It is therefore apparent that, as long as the condition is satisfied that the resistors have the same kind of temperature dependence, the same effect as described above can be expected even when the resistors have the temperature dependences.

Note that, as long as the current I can be generated, the configuration of the reference current generating circuit 241 is not limited to the configuration of the second embodiment.

Note that, as long as the current Iz can be generated, the configuration of the current generating circuit 140 is not limited to the configuration of the second embodiment.

Note that, as long as the output voltage can be generated, the configuration of the voltage generating circuit 142 is not limited to the configuration of the second embodiment.

As described above, according to the reference voltage circuit of the second embodiment, by appropriately setting the sum of the voltage having the negative temperature characteristics and the voltage having the positive temperature characteristics, an arbitrary output voltage having arbitrary temperature characteristics can be obtained.

Third Embodiment

Figure 4:
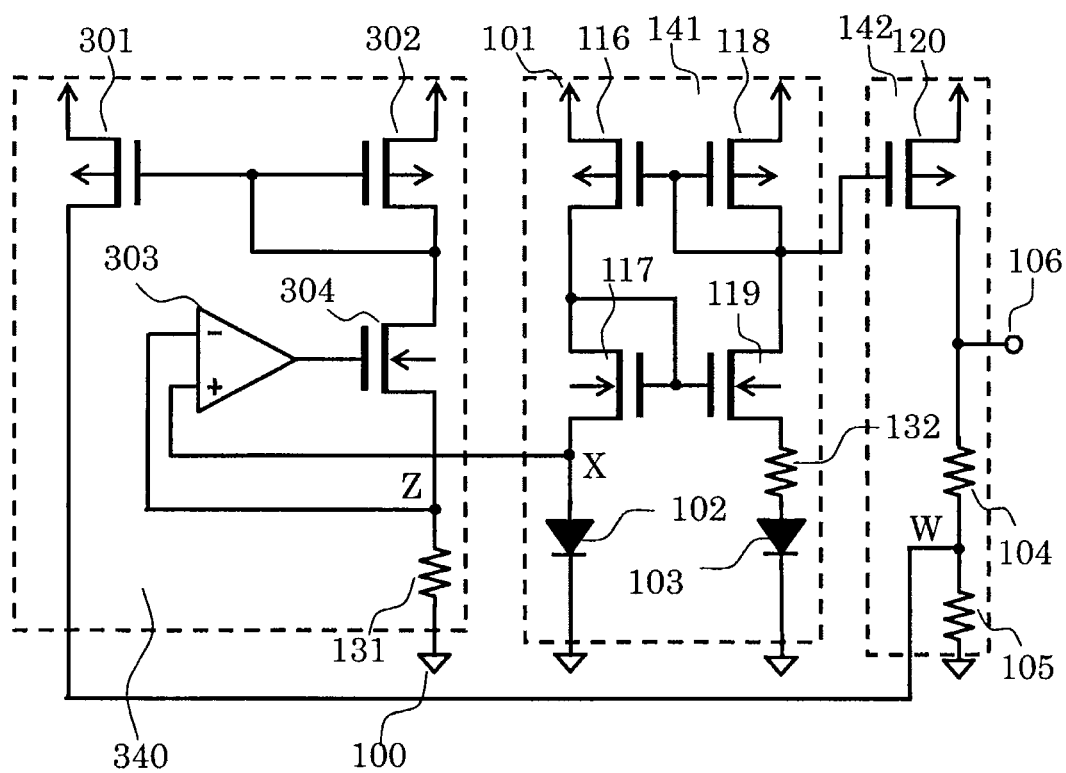
FIG. 4 is a circuit diagram illustrating a reference voltage circuit according to a third embodiment of the present invention.

FIG. 4 is a circuit diagram illustrating a reference voltage circuit according to a third embodiment of the present invention. FIG. 3 differs from FIG. 2 in that the configuration of the current generating circuit 140 is changed.

In the reference voltage circuit according to the third embodiment, PMOS transistors 301 and 302, an NMOS transistor 304, the resistor 131, and an amplifier 303 form a current generating circuit 340. Other configurations are the same as those of the reference voltage circuit according to the first embodiment illustrated in FIG. 2.

The connections are now described. The amplifier 303 has an inverting input terminal connected to a source of the NMOS transistor 304 and one terminal of the resistor 131, a non-inverting input terminal connected to the source of the NMOS transistor 117 and the anode of the PN junction element 102, and an output terminal connected to a gate of the NMOS transistor 304. The other terminal of the resistor 131 is connected to the ground terminal 100. The PMOS transistor 302 has a gate and a drain both connected to a drain of the NMOS transistor 304, and a source connected to the power supply terminal 101. The PMOS transistor 301 has a gate connected to the gate of the PMOS transistor 302, a drain connected to the node between one terminal of the resistor 104 and one terminal of the resistor 105, and a source connected to the power supply terminal 101. Other connections are the same as those in the reference voltage circuit according to the first embodiment illustrated in FIG. 2.

Next, the operation of the reference voltage circuit according to the third embodiment is described. For the sake of convenience and easy understanding, a description is given on the assumption that the resistors 131, 132, 104, and 105 have no temperature dependence. The PN junction elements 102 and 103 are formed with an appropriate area ratio (for example, 1:4), and the reference current generating circuit 141 generates the same current as that of the first embodiment. Because it is assumed that the resistor 132 has no temperature dependence, the current to be generated has positive temperature characteristics. The source of the NMOS transistor 117 is referred to as a node X, the source of the NMOS transistor 304 is referred to as a node Z, and the node between one terminal of the resistor 104 and one terminal of the resistor 105 is referred to as a node W.

The amplifier 303 and the NMOS transistor 304 form a negative feedback loop. Because of this, the voltages of the node X and the node Z are controlled to be the same.

The resistance value of the resistor 131 is represented by R131, and a voltage generated at the PN junction element 102 is represented by V102. A current that flows through the PMOS transistor 113 is represented by Iz. The current Iz flows through the resistor 131, and hence a voltage of R131×Iz is generated at the resistor 131. In addition, the voltages of the node X and the node Z are the same, and hence the voltage R131×Iz is equal to the voltage V102.

The PMOS transistor 301 and the PMOS transistor 302 form a current mirror, and hence a current based on the current of the PMOS transistor 302 flows through the PMOS transistor 301. For the sake of convenience and easy understanding, a description is given on the assumption that the same amount of the current Iz flows. The PMOS transistor 120 and the PMOS transistor 118 form a current mirror, and hence a current based on the current of the PMOS transistor 118 flows through the PMOS transistor 120. For the sake of convenience and easy understanding, a description is given on the assumption that the same amount of the current I flows. When the resistance value of the resistor 105 is represented by R105 and the above-mentioned structure is employed, the predetermined current I+Iz flows through the resistor 105, and hence the voltage of R105×(I+Iz) is generated at the resistor 105.

The voltage of the node X generated at the PN junction element 102 has negative temperature characteristics. Therefore, the voltage of the node Z also has the negative temperature characteristics.

In other words, the voltage R131×Iz has the negative temperature characteristics, and hence a voltage component R105×Iz, which is obtained by multiplying this voltage by a resistance ratio and is generated at the resistor 105, also has the negative temperature characteristics.

On the other hand, the current generated by the reference current generating circuit 141 has the positive temperature characteristics, and hence the current I flowing through the PMOS transistor 120 also has the positive temperature characteristics. When the resistance value of the resistor 104 is represented by R104, the sum of a voltage component R104×I generated across both ends of the resistor 104 and a voltage component R105×I generated at the resistor 105 has the positive temperature characteristics.

By appropriately setting the sum of the voltage component R131×Iz having the negative temperature characteristics and the voltage components R104×I and R105×I having the positive temperature characteristics, an arbitrary output voltage having arbitrary temperature characteristics can be output to the output terminal 106. This operation can be achieved by, for example, adjusting the current mirror ratio of the PMOS transistor 116 and the PMOS transistor 120, the current mirror ratio of the PMOS transistor 302 and the PMOS transistor 301, and the resistance values of the resistor 104 and the resistor 105.

Figure 9:
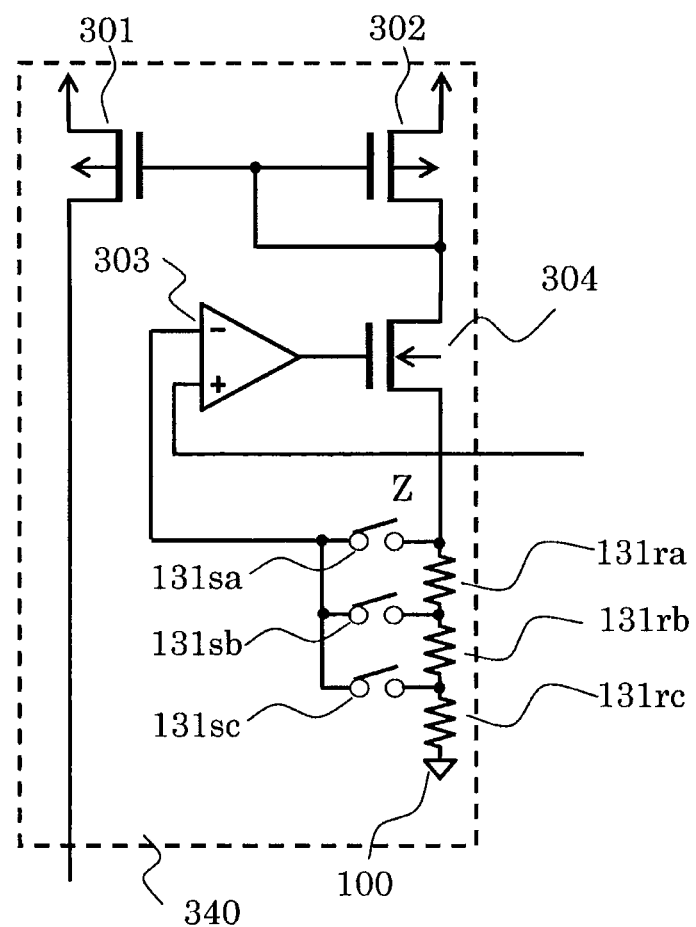
FIG. 9 is a circuit diagram illustrating means for adjusting a reference voltage in the third and fourth embodiments.

In addition, as in the current generating circuit 340 illustrated in FIG. 9, the resistor 131 may be divided into the resistors 131ra, 131rb, and 131rc, and the switch elements 131sa, 131sb, and 131sc may be connected between the nodes of the respective resistors and the inverting input terminal of the amplifier. By arbitrarily switching those switch elements to adjust the voltage of the output terminal 106, it is possible to adjust the voltage of the output terminal 106. Whether the resistor 131 is connected in series or in parallel, and the number of the resistors 131 are not limited to the configuration of the embodiment. Further, the material of the switch and the number of the switches are not limited to the configuration of the embodiment, and the switch may be a transistor or a fuse.

Note that, the PN junction element can be a saturated connected diode or bipolar transistor, or a MOS transistor operating in weak inversion, and is not limited to any specific form.

Note that, the above description is given on the assumption that the various current mirror ratios are equal to each other. However, as long as an arbitrary voltage having arbitrary temperature characteristics can be output, the current mirror ratios are not specifically limited.

Note that, the amplifier 303 is not limited to one form as long as the voltage values of the node X and the node Z can be adjusted.

Note that, the above description is given on the assumption that the various resistors have no temperature dependence, but the resistors may have temperature dependences. When such a relationship is established that the current I and the current Iz are obviously inversely proportional to the resistance values, an output voltage, which is to be generated when a current generated based on the relationship flows through the resistors, does not directly depend on the resistance values. It is therefore apparent that, as long as the condition is satisfied that the resistors have the same kind of temperature dependence, the same effect as described above can be expected even when the resistors have the temperature dependences.

Note that, as long as the current I can be generated, the configuration of the reference current generating circuit 141 is not limited to the configuration of the third embodiment.

Note that, as long as the current Iz can be generated, the configuration of the current generating circuit 340 is not limited to the configuration of the third embodiment.

Note that, as long as the output voltage can be generated, the configuration of the voltage generating circuit 142 is not limited to the configuration of the third embodiment.

As described above, according to the reference voltage circuit of the third embodiment, by appropriately setting the sum of the voltage having the negative temperature characteristics and the voltage having the positive temperature characteristics, an arbitrary output voltage having arbitrary temperature characteristics can be obtained.

Fourth Embodiment

Figure 5:
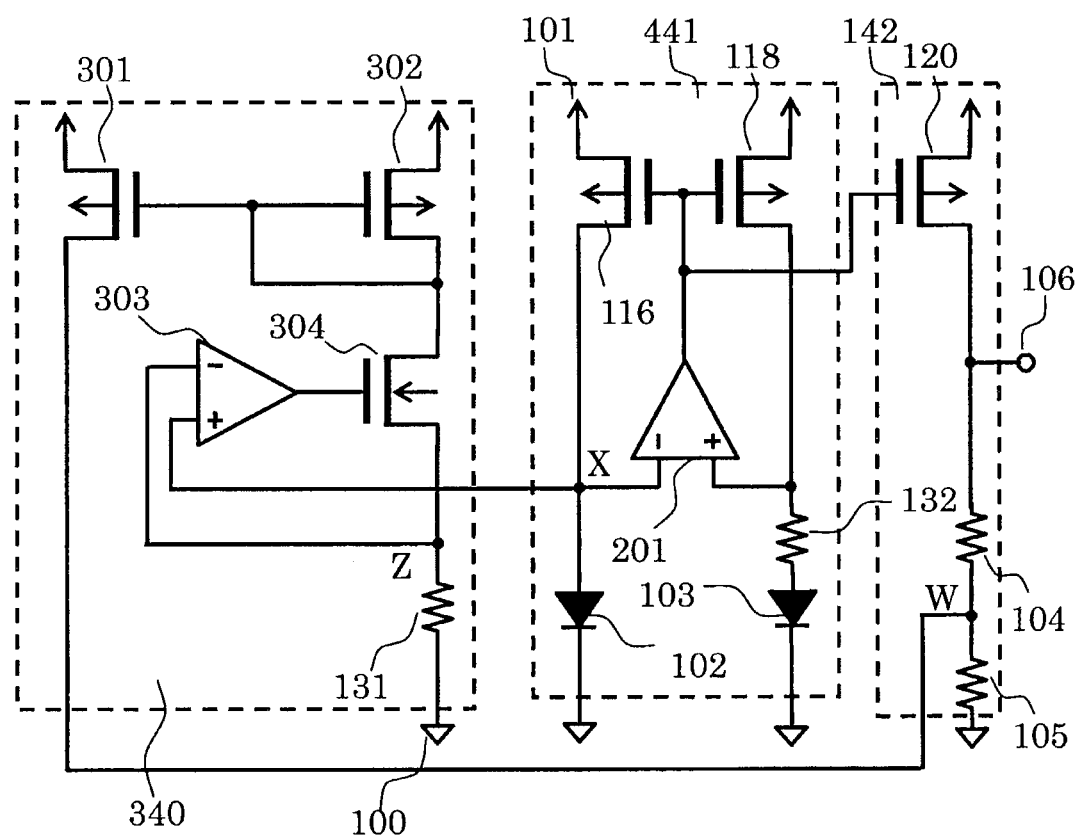
FIG. 5 is a circuit diagram illustrating a reference voltage circuit according to a fourth embodiment of the present invention.

FIG. 5 is a circuit diagram illustrating a reference voltage circuit according to a fourth embodiment of the present invention. FIG. 5 differs from FIG. 3 in that the configuration of the current generating circuit 140 is changed, and the NMOS transistor 202 is eliminated.

In the reference voltage circuit according to the fourth embodiment, the PMOS transistors 301 and 302, the NMOS transistor 304, the resistor 131, and the amplifier 303 form the reference current generating circuit 340. Other configurations are the same as those of the reference voltage circuit according to the second embodiment illustrated in FIG. 3.

The connections are now described. The amplifier 303 has the inverting input terminal connected to the source of the NMOS transistor 304 and one terminal of the resistor 131, the non-inverting input terminal connected to the anode of PN junction element 102, the drain of the PMOS transistor 116, and the inverting input terminal of the amplifier 203, and an output terminal connected to the gate of the NMOS transistor 304. The other terminal of the resistor 131 is connected to the ground terminal 100. The PMOS transistor 302 has the gate and the drain both connected to the drain of the NMOS transistor 304, and a source connected to the power supply terminal 101. The PMOS transistor 301 has the gate connected to the gate of the PMOS transistor 302, the drain connected to the node between the resistor 104 and the resistor 105, and the source connected to the power supply terminal 101. Other connections are the same as those in the reference voltage circuit according to the second embodiment illustrated in FIG. 3.

Next, the operation of the reference voltage circuit according to the fourth embodiment is described. For the sake of convenience and easy understanding, a description is given on the assumption that the resistors 131, 132, 104, and 105 have no temperature dependence. The PN junction elements 102 and 103 are formed with an appropriate area ratio (for example, 1:4), and a reference current generating circuit 441 generates a current having the positive temperature characteristics if the resistor 132 has no temperature dependence as in the second embodiment. The anode of the PN junction element 102 is referred to as a node X, the source of the NMOS transistor 304 is referred to as a node Z, and the node between the resistor 104 and the resistor 105 is referred to as a node W.

The amplifier 303 and the NMOS transistor 304 form a negative feedback loop. Because of this, the voltages of the node X and the node Z are controlled to be the same.

The resistance value of the resistor 131 is represented by R131, and a voltage generated at the PN junction element 102 is represented by V102. A current that flows through the PMOS transistor 302 is represented by Iz. The current Iz flows through the resistor 131, and hence a voltage of R131×Iz is generated at the resistor 131. In addition, the voltages of the node X and the node Z are the same, and hence the voltage R131×Iz is equal to the voltage V102.

The PMOS transistor 301 and the PMOS transistor 302 form a current mirror, and hence a current based on the current of the PMOS transistor 302 flows through the PMOS transistor 301. For the sake of convenience and easy understanding, a description is given on the assumption that the same amount of the current Iz flows. The PMOS transistor 120 and the PMOS transistor 118 form a current mirror, and hence a current based on the current of the PMOS transistor 118 flows through the PMOS transistor 120. For the sake of convenience and easy understanding, a description is given on the assumption that the same amount of the current I flows. When the resistance value of the resistor 105 is represented by R105 and the above-mentioned structure is employed, the predetermined current I+Iz flows through the resistor 105, and hence the voltage of R105×(I+Iz) is generated at the resistor 105.

The voltage of the node X generated at the PN junction element 102 has negative temperature characteristics. Therefore, the voltage of the node Z also has the negative temperature characteristics.

In other words, the voltage R131×Iz has the negative temperature characteristics, and hence the voltage component R105×Iz, which is obtained by multiplying this voltage by a resistance ratio and is generated at the resistor 105, also has the negative temperature characteristics.

On the other hand, the current generated by the reference current generating circuit 441 has the positive temperature characteristics, and hence the current I flowing through the PMOS transistor 120 also has the positive temperature characteristics. When the resistance value of the resistor 104 is represented by R104, the sum of a voltage component R104×I generated across both ends of the resistor 104 and a voltage component R105×I generated at the resistor 105 has the positive temperature characteristics.

By appropriately setting the sum of the voltage component R131×Iz having the negative temperature characteristics and the voltage components R104×I and R105×I having the positive temperature characteristics, an arbitrary output voltage having arbitrary temperature characteristics can be output to the output terminal 106. This operation can be achieved by, for example, adjusting the current mirror ratio of the PMOS transistor 116 and the PMOS transistor 120, the current mirror ratio of the PMOS transistor 302 and the PMOS transistor 301, and the resistance values of the resistor 104 and the resistor 105.

In addition, as in the current generating circuit 340 illustrated in FIG. 9, the resistor 131 may be divided into the resistors 131ra, 131rb, and 131re, and the switch elements 131sa, 131sb, and 131sc may be connected between the nodes of the respective resistors and the inverting input terminal of the amplifier. By arbitrarily switching those switch elements to adjust the voltage of the output terminal 106, it is possible to adjust the voltage of the output terminal 106. Whether the resistor 131 is connected in series or in parallel, and the number of the resistors 131 are not limited to the configuration of the embodiment. Further, the material of the switch and the number of the switches are not limited to the configuration of the embodiment, and the switch may be a transistor or a fuse.

Note that, the PN junction element can be a saturated connected diode or bipolar transistor, or a MOS transistor operating in weak inversion, and is not limited to any specific form.

Note that, the above description is given on the assumption that the various current mirror ratios are equal to each other. However, as long as an arbitrary output voltage having arbitrary temperature characteristics can be output, the current mirror ratios are not specifically limited.

Note that, the amplifier 303 is not limited to one form as long as the voltage values of the node X and the node Z can be adjusted.

Note that, the above description is given on the assumption that the various resistors have no temperature dependence, but the resistors may have temperature dependences. When such a relationship is established that the current I and the current Iz are obviously inversely proportional to the resistance values, an output voltage, which is to be generated when a current generated based on the relationship flows through the resistors, does not directly depend on the resistance values. It is therefore apparent that, as long as the condition is satisfied that the resistors have the same kind of temperature dependence, the same effect as described above can be expected even when the resistors have the temperature dependences.

Note that, as long as the current I can be generated, the configuration of the reference current generating circuit 441 is not limited to the configuration of the fourth embodiment.

Note that, as long as the current Iz can be generated, the configuration of the current generating circuit 340 is not limited to the configuration of the fourth embodiment.

Note that, as long as the output voltage can be generated, the configuration of the voltage generating circuit 142 is not limited to the configuration of the fourth embodiment.

As described above, according to the reference voltage circuit of the fourth embodiment, by appropriately setting the sum of the voltage having the negative temperature characteristics and the voltage having the positive temperature characteristics, an arbitrary output voltage having arbitrary temperature characteristics can be obtained.

Fifth Embodiment

Figure 6:
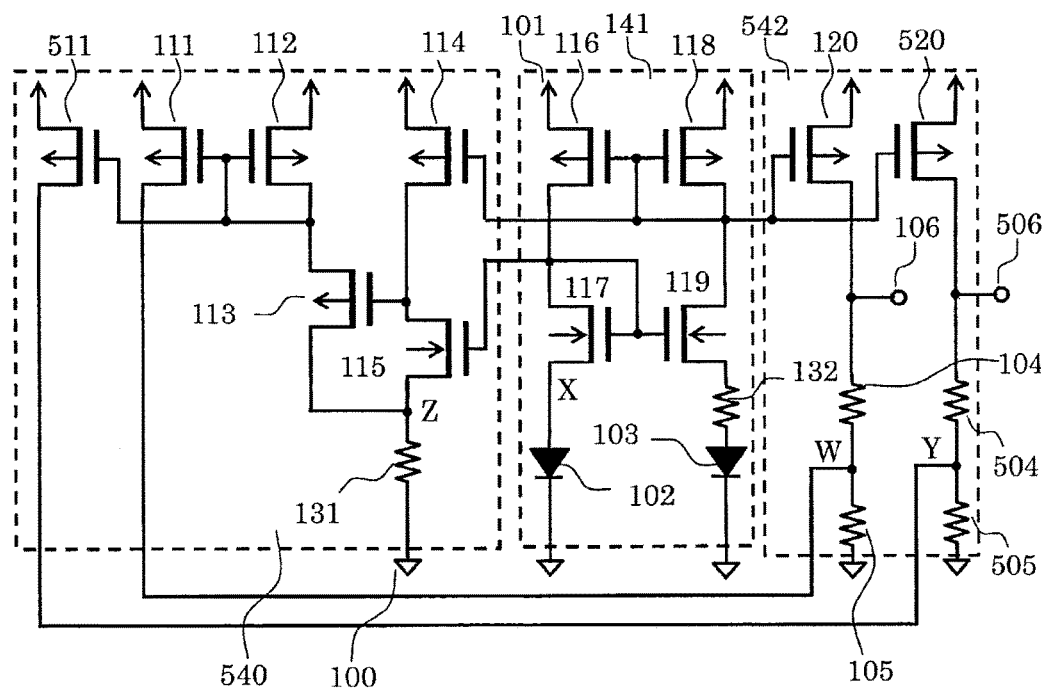
FIG. 6 is a circuit diagram illustrating a reference voltage circuit according to a fifth embodiment of the present invention.
Figure 7:
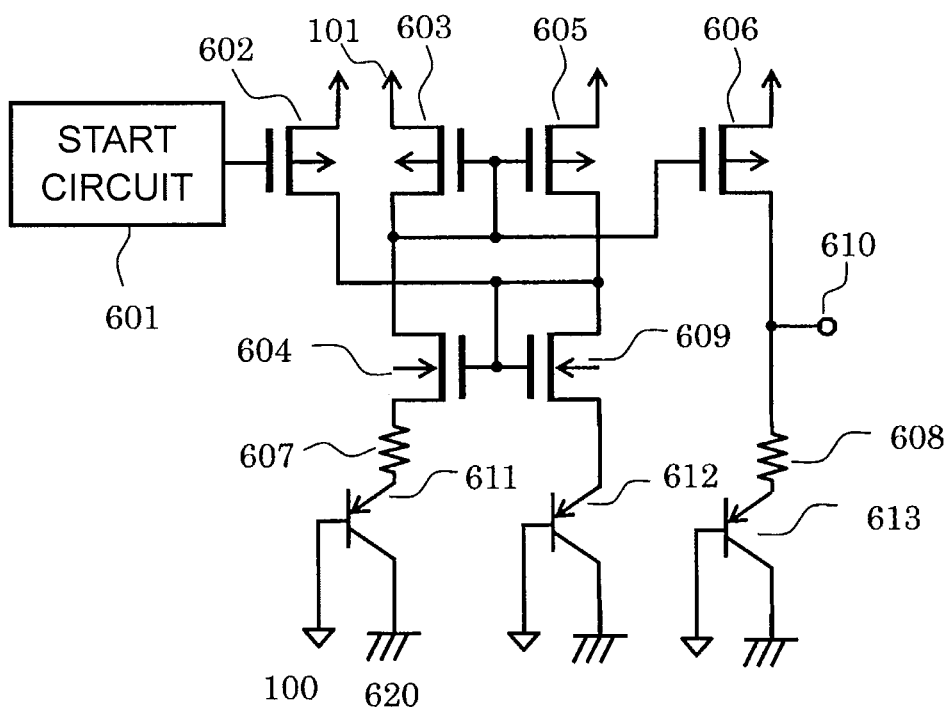
FIG. 7 is a circuit diagram illustrating a related-art reference voltage circuit.

FIG. 6 is a circuit diagram illustrating a reference voltage circuit according to a fifth embodiment of the present invention. FIG. 6 differs from FIG. 2 in that the configurations of the current generating circuit 140 and the voltage generating circuit 142 are changed.

The reference voltage circuit according to the fifth embodiment includes PMOS transistors 511 and 520, resistors 504 and 505, and an output terminal 506. The PMOS transistors 111, 112, 113, 114, and 511, the NMOS transistor 115, and the resistor 131 form a current generating circuit 540. The PMOS transistors 120 and 520, the resistors 504, 505, 104, and 105 form a voltage generating circuit 542. Other configurations are the same as those in the reference voltage circuit according to the first embodiment illustrated in FIG. 2.

The connections are now described. The PMOS transistor 511 has a gate connected to the gate of the PMOS transistor 111, a drain connected to a node between one terminal of the resistor 504 and one terminal of the resistor 505, and a source connected to the power supply terminal 101. The other terminal of the resistor 505 is connected to the ground terminal 100. The PMOS transistor 520 has a gate connected to the gate of the PMOS transistor 120, a source connected to the power supply terminal 101, and a drain connected to the output terminal 506 and the other terminal of the resistor 504. Other connections are the same as those in the reference voltage circuit according to the first embodiment illustrated in FIG. 2.

Next, the operation of the reference voltage circuit according to the fifth embodiment is described. For the sake of convenience and easy understanding, a description is given on the assumption that the resistors 131, 132, 104, 105, 504, and 505 have no temperature dependence. The PN junction elements 102 and 103 are formed with an appropriate area ratio (for example, 1:4), and the reference current generating circuit 141 generates a current having the positive temperature characteristics if the resistor 132 has no temperature dependence as in the first embodiment. The anode of the PN junction element 102 is referred to as a node X, the source of the NMOS transistor 115 is referred to as a node Z, the node between the resistor 104 and the resistor 105 is referred to as a node W, and the node between the resistor 504 and the resistor 505 is referred to as a node Y.

The NMOS transistor 115 and the PMOS transistor 113 form a negative feedback loop. Because of this, the current I stably flows through the NMOS transistor 115 from the PMOS transistor 114, and the operating point of the NMOS transistor 115 is thus appropriately determined. The NMOS transistor 115 and the NMOS transistor 117 are applied with the same gate voltage and the same drain current, and hence the voltages of the node X and the node Z are the same. The resistance value of the resistor 131 is represented by R131, and a voltage generated at the PN junction element 102 is represented by V102. A current that flows through the PMOS transistor 113 is represented by Iz. The currents I and Iz flow through the resistor 131, and hence a voltage of R131×(I+Iz) is generated at the resistor 131. In addition, the voltages of the node X and the node Z are the same, and hence the voltage R131×(I+Iz) is equal to the voltage V102 of the node X.

The PMOS transistor 111 and the PMOS transistor 112 form a current mirror, and hence a current based on the current of the PMOS transistor 112 flows through the PMOS transistor 111. For the sake of convenience and easy understanding, a description is given on the assumption that the same amount of the current Iz flows. The PMOS transistor 120 and the PMOS transistor 118 form a current mirror, and hence a current based on the current of the PMOS transistor 118 flows through the PMOS transistor 120. For the sake of convenience and easy understanding, a description is given on the assumption that the same amount of the current I flows. When the resistance value of the resistor 105 is represented by R105 and the above-mentioned structure is employed, a predetermined current I+Iz flows through the resistor 105, and hence a voltage of R105×(I+Iz) is generated at the resistor 105. For the sake of convenience and easy understanding, the resistance values R105 and R131 are equal to each other, in other words, the voltage R131×(I+Iz) of the node Z and the voltage R105×(I+Iz) of the node W are equal to each other.

The PMOS transistor 511 and the PMOS transistor 112 form a current mirror, and hence a current based on the current of the PMOS transistor 112 flows through the PMOS transistor 511. For the sake of convenience and easy understanding, a description is given on the assumption that the same amount of the current Iz flows. The PMOS transistor 520 and the PMOS transistor 118 form a current mirror, and hence a current based on the current of the PMOS transistor 118 flows through the PMOS transistor 520. For the sake of convenience and easy understanding, a description is given on the assumption that the same amount of the current I flows. When the resistance value of the resistor 505 is represented by R505 and the above-mentioned structure is employed, a predetermined current I+Iz flows through the resistor 505, and hence a voltage of R505×(I+Iz) is generated at the resistor 505. For the sake of convenience and easy understanding, the resistance values R505 and R131 are equal to each other, in other words, the voltage R131×(I+Iz) of the node Z and the voltage R505×(I+Iz) of the node Y are equal to each other.

The voltage of the node X generated at the PN junction element 102 has negative temperature characteristics. Therefore, the voltage of the node Z and the voltages of the node W and the node Y also have the negative temperature characteristics.

The current generated by the reference current generating circuit 141 has the positive temperature characteristics, and hence the current I flowing through the PMOS transistors 120 and 520 also has the positive temperature characteristics. When the resistance value of the resistor 104 is represented by R104, a voltage of I×R104 is generated across both ends of the resistor 104, which has the positive temperature characteristics. When the resistance value of the resistor 504 is represented by R504, a voltage of I×R504 is generated across both ends of the resistor 504, which has the positive temperature characteristics.

By appropriately setting the sum of the voltage R105× (I+Iz) of the node W having the negative temperature characteristics and the voltage I×R104 that has the positive temperature characteristics and is generated across both ends of the resistor 104, an arbitrary output voltage having arbitrary temperature characteristics can be output to the output terminal 106. This operation can be achieved by, for example, adjusting the current mirror ratio of the PMOS transistor 118 and the PMOS transistor 120, the current mirror ratio of the PMOS transistor 118 and the PMOS transistor 114, the current mirror ratio of the PMOS transistor 112 and the PMOS transistor 111, and the resistance values of the resistor 104 and the resistor 105.

By appropriately setting the sum of the voltage R505× (I+Iz) of the node Y having the negative temperature characteristics and the voltage I×R504 that has the positive temperature characteristics and is generated across both ends of the resistor 504, an arbitrary output voltage having arbitrary temperature characteristics can be output to the output terminal 506. This operation can be achieved by, for example, adjusting the current mirror ratio of the PMOS transistor 118 and the PMOS transistor 520, the current mirror ratio of the PMOS transistor 118 and the PMOS transistor 114, the current mirror ratio of the PMOS transistor 112 and the PMOS transistor 511, and the resistance values of the resistor 504 and the resistor 505.

In addition, as in the current generating circuit 140 illustrated in FIG. 8, the resistor 131 may be divided into the resistors 131*ra*, 131*rb*, and 131*rc*, and the switch elements 131*sa*, 131*sb*, and 131*sc* may be connected between the nodes of the respective resistors and the drain of the PMOS transistor 113. By arbitrarily switching those switch elements to adjust the current Iz, it is possible to adjust the voltages of the output terminal 106 and 506. Whether the resistor 131 is connected in series or in parallel, and the number of the resistors 131 are not limited to the configuration of the embodiment. Further, the material of the switch and the number of the switches are not limited to the configuration of the embodiment, and the switch may be a transistor or a fuse.

Note that, the PN junction element can be a saturated connected diode or bipolar transistor, or a MOS transistor operating in weak inversion, and is not limited to any specific form.

Note that, the above description is given on the assumption that the various current mirror ratios are equal to each other. However, as long as an arbitrary output voltage having arbitrary temperature characteristics can be output, the current mirror ratios are not specifically limited.

Note that, the NMOS transistor 115 and the NMOS transistor 117 are the same in size in the above description. However, the NMOS transistor 115 and the NMOS transistor 117 are not limited to be the same in size as long as the voltage values of the node X and the node Z can be adjusted by adjusting the resistor 131 and the current value of the current flowing through the PMOS transistor 114.

Note that, the above description is given on the assumption that the various resistors have no temperature dependence, but the resistors may have temperature dependences. When such a relationship is established that the current I and the current Iz are obviously inversely proportional to the resistance values, an output voltage, which is to be generated when a current generated based on the relationship flows through the resistors, does not directly depend on the resistance values. It is therefore apparent that, as long as the condition is satisfied that the resistors have the same kind of temperature dependence, the same effect as described above can be expected even when the resistors have the temperature dependences.

Note that, as long as the current I can be generated, the configuration of the reference current generating circuit 141 is not limited to the configuration of the fifth embodiment.

Note that, as long as the current Iz can be generated, the configuration of the current generating circuit 540 is not limited to the configuration of the fifth embodiment.

Note that, as long as the output voltage can be generated, the configuration of the voltage generating circuit 542 is not limited to the configuration of the fifth embodiment.

Note that, the output voltages of two different magnitudes are exemplified in the fifth embodiment. However, even when there are output voltages of more different magnitudes, by similarly increasing the number of the output terminals of the current generating circuit 540, it is possible to adjust each output voltage to have arbitrary temperature characteristics and an arbitrary output voltage value. In addition, the number of the current generating circuits 540 may be increased to individually adjust the voltages of the output terminals 106 and 506.

As described above, according to the reference voltage circuit of the fifth embodiment, by appropriately setting the sum of the voltage having the negative temperature characteristics and the voltage having the positive temperature characteristics, an arbitrary output voltage having arbitrary temperature characteristics can be obtained. Further a second voltage having a different output voltage value and different temperature characteristics can be output.

What is claimed is:
1. A reference voltage circuit, comprising:
   a reference current generating circuit configured to convert a difference between forward voltages of a plurality of PN junction elements into current to generate a first current;

a current generating circuit configured to use the first current generated by the reference current generating circuit to generate a second current, wherein the second current is directly outputted from the reference current generating circuit and the second current is different from the first current; and a voltage generating circuit configured to output a reference voltage, the voltage generating circuit comprising a first resistor and a second resistor, wherein the first resistor and the second resistor are connected in series with only the second resistor directly connected to a ground, wherein the second current which is directly outputted from the current generating circuit directly feeds to only the second resistor of the voltage generator circuit, and the first resistor being configured to generate a first voltage across the first resistor having positive temperature characteristics when the first current flows through the first resistor, the second resistor being configured to generate a second voltage across the second resistor having negative temperature characteristics when both the first current from the first resistor and the second current from the current generating circuit flow through the second resistor, wherein the reference voltage is obtained by adding the first voltage which is in series to the second voltage within the reference voltage circuit.

2. The reference voltage circuit according to claim 1, wherein the current generating circuit comprises:

a first transistor including a gate connected to the reference current generating circuit, and being configured to cause a current based on the first current to flow;

a second transistor including a gate connected to the reference current generating circuit and a drain connected to a drain of the first transistor, and being configured to cause the current based on the first current to flow;

a third transistor including a gate connected to the drain of the first transistor and a drain connected to a source of the second transistor, and being configured to cause the second current to flow;

a third resistor connected to the source of the second transistor and the drain of the third transistor, and being configured to cause the second current and the current based on the first current to flow;

a fourth transistor including a gate and a drain both connected to a source of the third transistor; and a fifth transistor including a gate connected to the gate of the fourth transistor and a drain connected to the voltage generating circuit, and being configured to cause the second current to flow through the second resistor.

3. The reference voltage circuit according to claim 2, wherein the reference current generating circuit comprises:

a sixth transistor including a gate and a drain both connected to the gate of the first transistor;

a seventh transistor including a gate connected to the gate and the drain of the sixth transistor;

an eighth transistor including a gate and a drain both connected to the gate of the second transistor and a drain of the seventh transistor;

a ninth transistor including a gate connected to the gate and the drain of the eighth transistor and a drain connected to the drain of the sixth transistor;

a first PN junction element connected to a source of the eighth transistor;

a fourth resistor including one terminal connected to a source of the ninth transistor; and a second PN junction element connected to another terminal of the fourth resistor.

* * * * *